United States Patent
Augustino et al.

(10) Patent No.: US 9,412,555 B2
(45) Date of Patent: Aug. 9, 2016

(54) LOWER ELECTRODE ASSEMBLY OF PLASMA PROCESSING CHAMBER

(75) Inventors: Jason Augustino, Fremont, CA (US); Quan Chau, San Jose, CA (US); Keith William Gaff, Fremont, CA (US); Hanh Tuong Ha, San Jose, CA (US); Brett C. Richardson, San Ramon, CA (US); Harmeet Singh, Fremont, CA (US)

(73) Assignee: LAM RESEARCH CORPORATION, Fremont, CA (US)

(*) Notice: Subject to any disclaimer, the term of this patent is extended or adjusted under 35 U.S.C. 154(b) by 1966 days.

(21) Appl. No.: 12/609,377

(22) Filed: Oct. 30, 2009

(65) Prior Publication Data

US 2010/0108261 A1    May 6, 2010

Related U.S. Application Data

(60) Provisional application No. 61/193,151, filed on Oct. 31, 2008.

(51) Int. Cl.
*H01J 37/20* (2006.01)
*H01J 37/32* (2006.01)

(52) U.S. Cl.
CPC .......... *H01J 37/20* (2013.01); *H01J 37/3255* (2013.01); *H01J 37/32091* (2013.01); *H01J 37/32541* (2013.01); *H01J 37/32642* (2013.01); *H01J 37/32715* (2013.01)

(58) Field of Classification Search
CPC .............. H01J 37/20; H01J 37/32541; H01J 37/32715; H01J 37/32091; H01J 37/32642; H01J 37/3255
See application file for complete search history.

(56) References Cited

U.S. PATENT DOCUMENTS 5,556,500 A     9/1996   Hasegawa et al.
5,573,596 A *  11/1996   Yin .......................... 118/723 E (Continued)

FOREIGN PATENT DOCUMENTS

JP     7-245292 A    9/1995
JP     8264515 A    10/1996

(Continued)

OTHER PUBLICATIONS

Pseudospark switches. http://users.tm.net/lapointe/Pseudospark_Switches.html. 2001.*

(Continued)

*Primary Examiner* — Gordon R Baldwin
*Assistant Examiner* — Yuechuan Yu
(74) *Attorney, Agent, or Firm* — Buchanan Ingersoll & Rooney PC

(57) ABSTRACT

A lower electrode assembly for use in a plasma processing chamber comprises a metal base and upper and lower edge rings. The metal base comprises metal plates brazed together and forming a brazed line on a lower side surface of the base, an edge ring support surface extending horizontally inwardly from the lower side surface and an upper side surface above the edge ring support surface. The upper edge ring comprises a lower surface mounted on the edge ring support surface and the lower edge ring surrounds the lower side surface of the base with a gap between opposed surfaces of the upper and lower edge rings and between the lower edge ring and the outer periphery of the base. The gap has an aspect ratio of total gap length to average gap width sufficient to impede arcing at the location of the braze line.

12 Claims, 5 Drawing Sheets

(56) References Cited

U.S. PATENT DOCUMENTS

| | | | |
|---|---|---|---|
| 5,805,408 | A | 9/1998 | Maraschin et al. |
| 5,824,605 | A | 10/1998 | Chen et al. |
| 5,948,704 | A | 9/1999 | Benjamin et al. |
| 5,958,265 | A | 9/1999 | Ogahara |
| 5,998,932 | A | 12/1999 | Lenz |
| 6,013,155 | A | 1/2000 | McMillin et al. |
| 6,013,984 | A | 1/2000 | Ellinger et al. |
| 6,039,836 | A | 3/2000 | Dhindsa et al. |
| 6,230,651 | B1 | 5/2001 | Ni et al. |
| 6,284,093 | B1 | 9/2001 | Ke et al. |
| 6,333,272 | B1 | 12/2001 | McMillin et al. |
| 6,383,931 | B1 | 5/2002 | Flanner et al. |
| 6,824,627 | B2 | 11/2004 | Dhindsa et al. |
| 6,872,281 | B1 | 3/2005 | Chen et al. |
| 6,896,765 | B2 * | 5/2005 | Steger ............. 156/345.51 |
| 7,220,319 | B2 * | 5/2007 | Sago et al. ............. 118/725 |
| 7,588,668 | B2 * | 9/2009 | Ye et al. ............. 204/298.12 |
| 2002/0139478 | A1 | 10/2002 | Ma et al. |
| 2005/0005859 | A1 * | 1/2005 | Koshiishi et al. ........ 118/728 |
| 2005/0061447 | A1 | 3/2005 | Kim et al. |
| 2005/0155718 | A1 | 7/2005 | Huang et al. |
| 2006/0043067 | A1 | 3/2006 | Kadkhodayan et al. |
| 2009/0008035 | A1 | 1/2009 | Iwai |

FOREIGN PATENT DOCUMENTS

| | | |
|---|---|---|
| JP | 8-316299 A | 11/1996 |
| JP | 2008-511175 A | 4/2008 |
| WO | 2005/074450 A2 | 8/2005 |
| WO | 2007/032420 A1 | 3/2007 |

OTHER PUBLICATIONS

International Search Report and Written Opinion mailed Jun. 11, 2010 for PCT/US2009/005857.

Extended European Search Report dated Sep. 29, 2015, issued by the European Patent Office in the corresponding European Application No. 09829445.7. (9 pages).

Office Action issued on May 29, 2015, by the Korean Intellectual Property Office in corresponding Korean Patent Application No. 10-2011-7010001 (4 pages).

Notification of Examination Opinions issued Dec. 26, 2014 for Taiwan Patent Appln. No. 98136933.

* cited by examiner

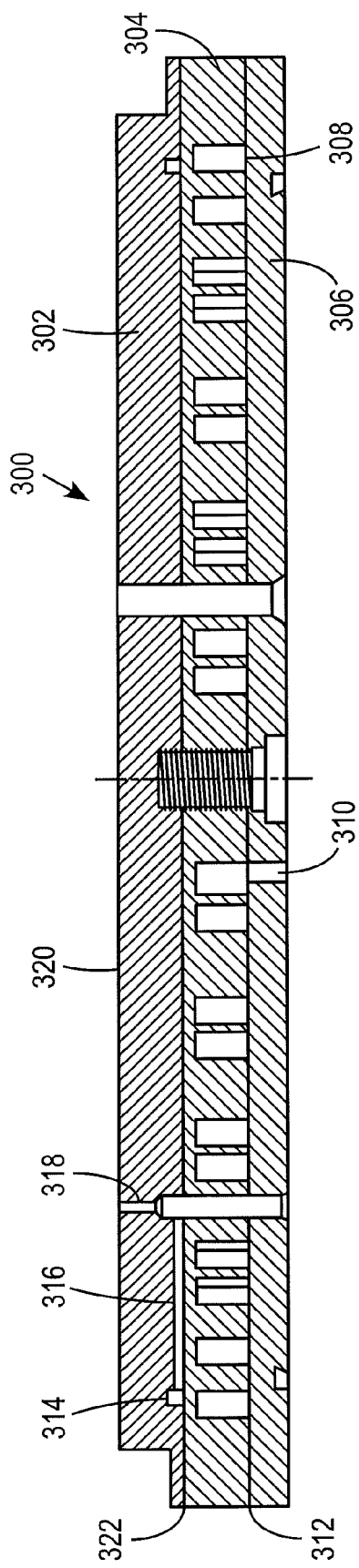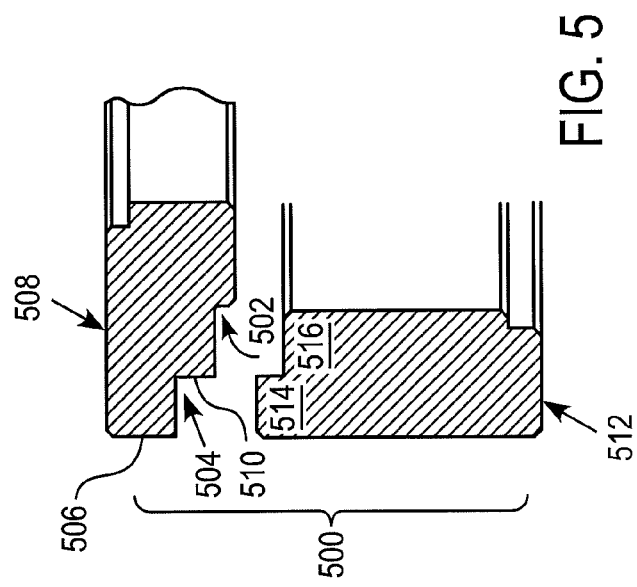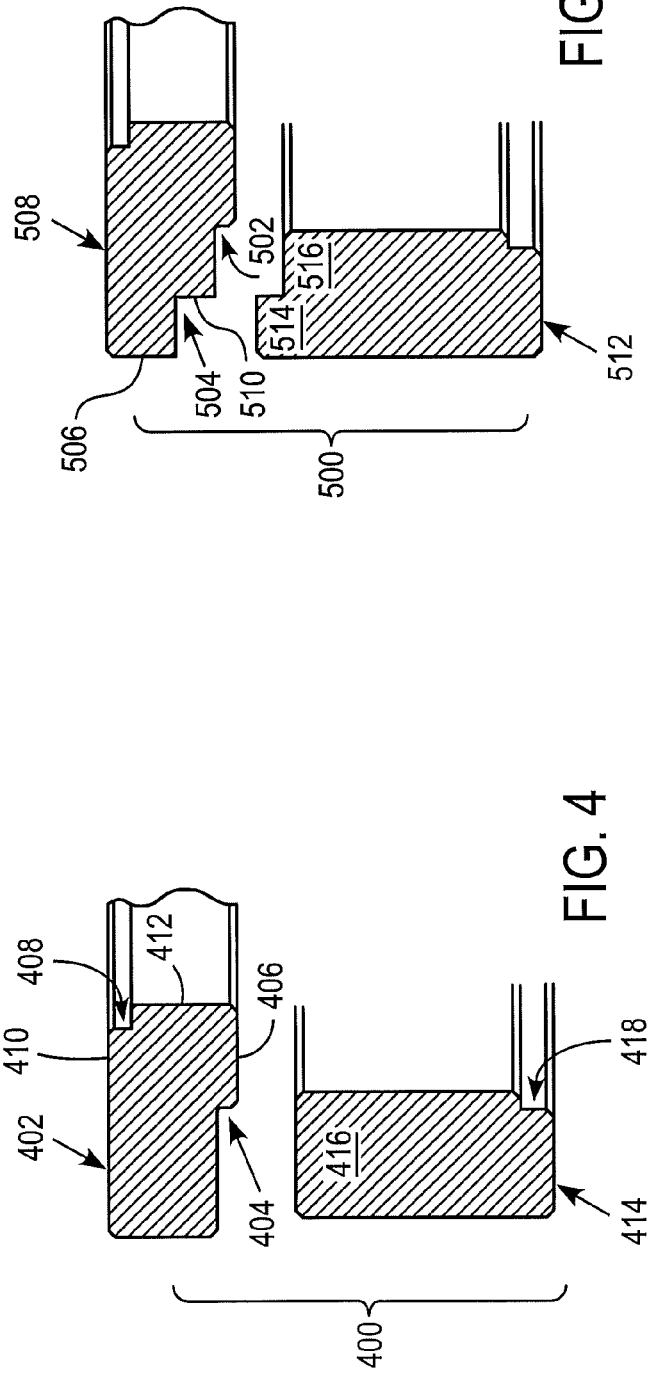

LOWER ELECTRODE ASSEMBLY OF PLASMA PROCESSING CHAMBER

CROSS-REFERENCE TO RELATED APPLICATION

This application claims priority under 35 U.S.C. §119 to U.S. Provisional Application No. 61/193,151, filed Oct. 31, 2008, the entire content of which is hereby incorporated by reference.

BACKGROUND

In the description that follows reference is made to certain structures and methods, however, such references should not necessarily be construed as an admission that these structures and methods qualify as prior art under the applicable statutory provisions. Applicants reserve the right to demonstrate that any of the referenced subject matter does not constitute prior art.

In the field of conductor (metal) processing, plasma processing chambers are commonly used to etch one or more layers formed on a substrate. During etching, the substrate is supported on a substrate support surface within the chamber. Substrate supports can include edge rings positioned around the substrate support (i.e., around the substrate) for confining plasma to the volume above the substrate and/or to protect the substrate support, which typically includes a clamping mechanism, from erosion by the plasma. The edge rings, sometimes called focus rings, can be sacrificial (i.e., consumable) parts. Conductive and non-conductive edge rings are described in commonly-owned U.S. Pat. Nos. 5,805,408; 5,998,932; 6,013,984; 6,039,836 and 6,383,931.

During plasma etching, plasma is formed above the surface of a substrate by adding large amounts of energy to a gas (or gas mixture) at low pressure. The plasma may contain ions, free radicals, and neutral species with high kinetic energies. By adjusting the electrical potential of the substrate, charged species in the plasma can be directed to impinge upon the surface of the substrate and thereby remove material (e.g., atoms) therefrom.

SUMMARY

A lower electrode assembly for use in a plasma processing chamber comprises a metal base and upper and lower edge rings. The metal base comprises metal plates brazed together and forming a brazed line on a lower side surface of the base, an edge ring support surface extending horizontally inwardly from the lower side surface and an upper side surface above the edge ring support surface. The upper edge ring comprises a lower surface mounted on the edge ring support surface and the lower edge ring surrounds the lower side surface of the base with a gap between opposed surfaces of the upper and lower edge rings and between the lower edge ring and the outer periphery of the base. The gap has an aspect ratio of total gap length to average gap width sufficient to impede arcing at the location of the braze line.

BRIEF DESCRIPTION OF THE DRAWINGS

FIG. 3 is an illustration of the cross-section of the baseplate shown in FIG. 2.

FIG. 4 shows details of the upper and lower edge rings of the assembly shown in FIG. 2.

FIG. 5 shows details of a labyrinth edge ring assembly in accordance with a preferred embodiment.

DETAILED DESCRIPTION OF PREFERRED EMBODIMENTS

Plasma chambers are generally used for etching layers of materials on substrates by supplying an etching gas comprising one or more gases to the chamber and applying energy to the etching gas to energize the gas into a plasma state. Various plasma chamber designs are known wherein radio frequency (RF) energy, microwave energy and/or magnetic fields can be used to produce and sustain medium density or high density plasma.

In such plasma processing chambers process gas is supplied through a suitable arrangement such as a showerhead electrode or gas injection system and a semiconductor substrate supported on a lower electrode is plasma etched by plasma generated by supplying RF energy to the process gas.

For a metal etch process, the lower electrode assembly can be incorporated in a transformer coupled plasma (TCP™) reactor. Transformer coupled plasma reactors, wherein RF energy is inductively coupled into the reactor, are available from Lam Research Corporation, Fremont, Calif. An example of a high-flow plasma reactor that can provide high density plasma is disclosed in commonly-owned U.S. Pat. No. 5,948,704, the disclosure of which is hereby incorporated by reference.

Figure 1:
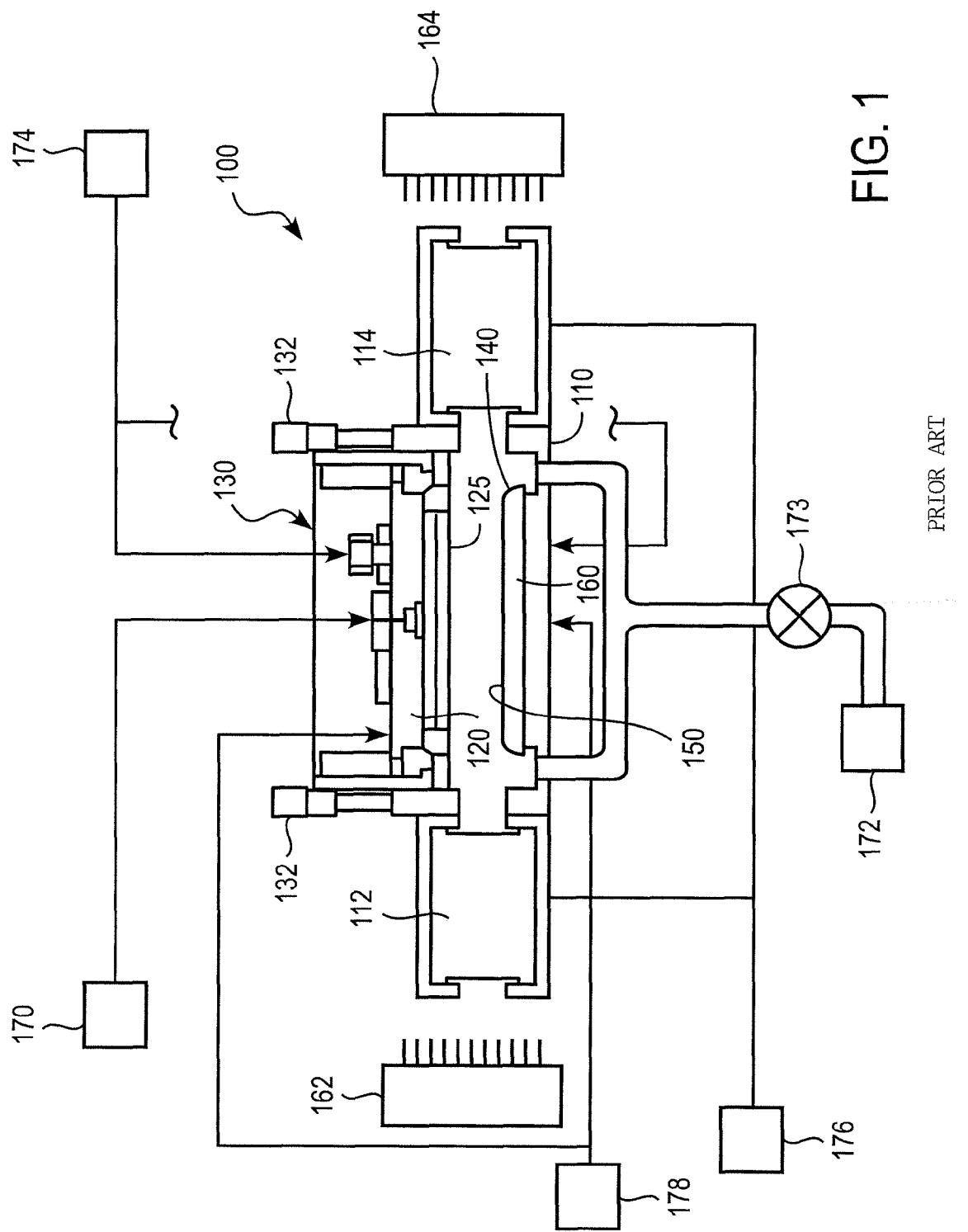
FIG. 1 is an illustration of a conventional plasma processing apparatus.

A parallel plate plasma etch reactor is illustrated in FIG. 1. The plasma etch reactor 100 comprises a chamber 110, an inlet load lock 112, and an optional outlet load lock 114, further details of which are described in commonly-owned U.S. Pat. No. 6,824,627, which is hereby incorporated by reference in its entirety.

The load locks 112 and 114 (if provided) include transfer devices to transfer substrates such as wafers from a wafer supply 162, through the chamber 110, and out to a wafer receptacle 164. A load lock pump 176 can provide a desired vacuum pressure in the load locks 112 and 114.

A vacuum pump 172 such as a turbo pump is adapted to maintain a desired pressure in the chamber. During plasma etching, the chamber pressure is controlled, and preferably maintained at a level sufficient to sustain a plasma. Too high a chamber pressure can disadvantageously contribute to etch stop while too low a chamber pressure can lead to plasma extinguishment. In a medium density plasma reactor, such as a parallel plate reactor, preferably the chamber pressure is maintained at a pressure below about 200 mTorr (e.g., less than 100 mTorr or less than 50 mTorr).

The vacuum pump can be connected to an outlet in a wall of the reactor and can be throttled by a valve 173 in order to control the pressure in the chamber. Preferably, the vacuum pump is capable of maintaining a pressure within the chamber of less than 200 mTorr while etching gases are flowed into the chamber.

The chamber 110 includes an upper electrode assembly 120 including an upper electrode 125 (e.g., showerhead electrode), and a lower electrode assembly 140 including a baseplate (i.e., lower electrode) 160 and a substrate support surface 150 formed in an upper surface thereof. The upper electrode assembly 120 is mounted in an upper housing 130. The upper housing 130 can be moved vertically by a mechanism 132 to adjust the gap between the upper electrode 125 and the substrate support surface 150.

A etching gas source 170 can be connected to the housing 130 to deliver etching gas comprising one or more gases to the upper electrode assembly 120. In a preferred etch reactor, the upper electrode assembly comprises a gas distribution system, which can be used to deliver reactant and/or carrier gases to a region proximate to the surface of a substrate. Gas distribution systems, which can comprise one or more gas rings, injectors and/or showerheads (e.g., showerhead electrodes), are disclosed in commonly-owned U.S. Pat. Nos. 6,333,272; 6,230,651; 6,013,155 and 5,824,605, the disclosures of which are hereby incorporated by reference.

The upper electrode 125 preferably comprises a showerhead electrode, which includes apertures (not shown) to distribute etching gas therethrough. The showerhead electrode can comprise one or more vertically spaced-apart baffle plates that can promote the desired distribution of etching gas. The upper and lower electrodes may be formed of any suitable material such as graphite, silicon, silicon carbide, aluminum (e.g., anodized aluminum), or combinations thereof. A heat transfer liquid source 174 can be connected to the upper electrode assembly 120 and another heat transfer liquid source can be connected to the baseplate 160.

While a parallel plate reactor is described above, the edge ring assembly can be used in other plasma processing systems such as inductively coupled plasma chambers.

Figure 2:
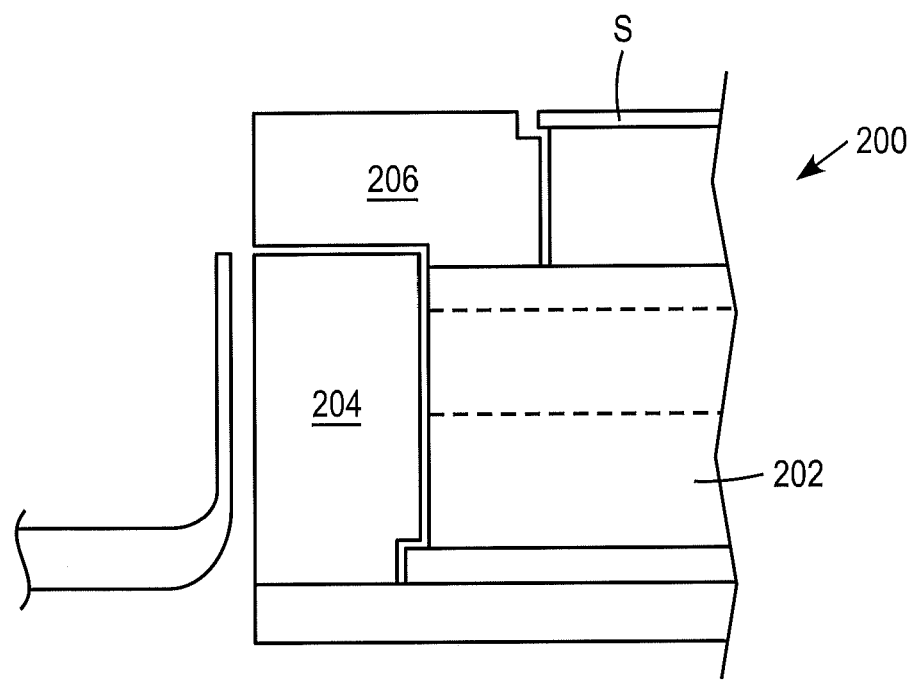
FIG. 2 is an illustration of a comparative lower electrode assembly.

FIG. 2 shows a substrate support 200 which includes a baseplate 202 on which a substrate S is supported, a lower edge ring 204 surrounding the baseplate 202, and an upper edge ring 206. The upper edge ring 206 includes a step on its lower surface mating with the upper end of the lower edge ring.

FIG. 3 shows a baseplate 300 comprising an upper plate 302, a middle plate 304 and a lower plate 306, preferably of an aluminum alloy such as 6061-T6. The middle plate 304 includes coolant passages 308 supplied coolant passing through inlet 310. Coolant circulated through the baseplate exits through an outlet (not shown). The passages 308 can be machined in a plate of aluminum such as 6061 and the bottom plate 306 is vacuum brazed at braze line 312 to middle plate 304 to enclose the channels.

The top plate 302 can include one or more gas channels 314 which are supplied a heat transfer gas such as He. One or more radially extending channels 316 machined into the underside of the top plate 302 can intersect lift pin holes 318 through which lift pins (not shown) move vertically to raise and lower wafers onto and off of the upper surface 320 of the baseplate. Circumferentially spaced apart axially extending gas passages (not shown) direct He of the gas channel 314 against the underside of the wafer. The top plate 302 is vacuum brazed at braze line 322 to the upper surface of the middle plate 304 to enclose the gas channel 314 and gas passage 316.

After brazing the top and bottom plates to the middle plate, an ESC ceramic laminate (not shown) is bonded to the upper surface of the top plate 302, the baseplate assembly is machined to provide a smooth surface and the assembly is anodized. The anodization results in a raised thickness of about 0.001 inch (25 μm) at the brazed lines 312, 322.

FIG. 4 shows an edge ring assembly designed to fit around the periphery of the baseplate 300. However when used to support a wafer in an inductively coupled plasma chamber during plasma etching of conductive material such as aluminum or other conductive layers arcing spots have been observed at numerous locations around the vacuum brazed joints 312, 322 after 45 hours. This edge ring assembly includes upper ring 404 and lower ring 414 having an annular horizontal gap having a gap height (H) ranging from 0.003 to 0.047 inch and gap length (L) of about 0.6 inch. The gap height has a range of 0.003 to 0.047 due to manufacturing machined surfaces with tolerances to allow fitting of the opposed surfaces of the upper and lower edge rings. For example, the rings can be machined quartz rings having inner diameters of about 12 or more inches for use on baseplates suitable for supporting 300 mm wafers. For example, the upper edge ring can have an inner diameter of about 12 inches and the lower edge ring inner diameter can be about 12.6 inches. An annular vertical gap having a gap range of 0.011 to 0.030 inch and length of about 1 inch separates the inner periphery of the lower edge ring from the outer periphery of the baseplate.

With reference to the FIG. 2 edge ring assembly, it has been found that an upper edge ring having a single small step in the lower surface thereof is ineffective at preventing arcing at the braze lines of the baseplate assembly. In contrast, an upper edge ring having a larger step, multiple steps or other modification to increase the aspect ratio of the gap can inhibit arcing at the braze lines. In particular, FIG. 4 shows a cross section of a one-step edge ring assembly 400 wherein upper edge ring 402 has a height (H) of 0.6 inch, an outer diameter (OD) of 13.820 inch, an inner diameter (ID) of 12.0 inches, a width (W) of 1.820 inches, wherein step 404 provides an offset of about 0.1 inch in lower surface 406. To accommodate the wafer's edge overhanging the upper surface of the baseplate, a recess 408 extends 0.108 inch below upper surface 410 inwardly from the inner periphery 412. Lower edge ring 414 includes upper end 416 which mates with recess 404. A recess 418 mates with a dielecrtric member beneath baseplate 300.

FIG. 5 shows an edge ring assembly which overcomes the arcing problem. The edge ring assembly includes upper edge ring 508 having a plurality of steps 502, 504 on a lower surface thereof which lengthens the gap between the opposed surfaces of the top and bottom edge rings and thus impede penetration of plasma to the location of the vacuum braze lines 312, 322. With this stepped ring, no arcing has been observed even after 2000 RF bias hours.

The two stepped edge ring assembly 500 includes inner step 502 and outer step 504. The inner step has a depth of 0.1 inch and second step 504 provides a recess 0.250 inch at the outer periphery 506 of upper edge ring 508 and extends from the outer periphery to vertical surface 510. Lower edge ring 512 includes projection 514 which mates with recess 504 and upper inner portion 516 mates with inner step 502.

The labyrinth edge ring assembly can be implemented with various edge ring configurations. In variation A, a single step is provided in the lower surface of the upper edge ring but with an increased vertical offset from the lower surface and the height of the lower edge ring can be increased accordingly. For example, the recess can extend 25 to 50% of the height of the edge ring. In variation B, two steps can be provided in the lower surface of the upper edge ring and the upper surface of the lower edge ring includes one or more projections mating with the lower surface of the upper edge ring. In variation C, a single step extending 25 to 50% of the edge ring height extends into the lower surface of the upper edge ring and the lower edge ring includes a single step mating with the recess in the upper edge ring. In variation D, the step in the lower surface of the upper edge ring extends more than 50% across the lower surface and the lower edge ring includes an inner projection extending over an outer portion of the edge ring mounting surface. The height of the step in variation D extends vertically 30 to 60% of the height of the upper edge ring. In variation E, the comparative edge ring assembly includes a dielectric barrier ring which fits in aligned grooves in the opposed surfaces of the upper and lower edge rings. The barrier ring fits in a groove having a depth of 10 to 40% of the height of the upper edge ring. In variation F, the upper edge ring includes a single annular recess in the lower surface thereof and the lower edge ring includes an annular projection mating with the recess. The recess extends 10 to 40% of the upper edge ring height and has a width of 15 to 60% of the width of the lower edge ring.

Figure 6A:
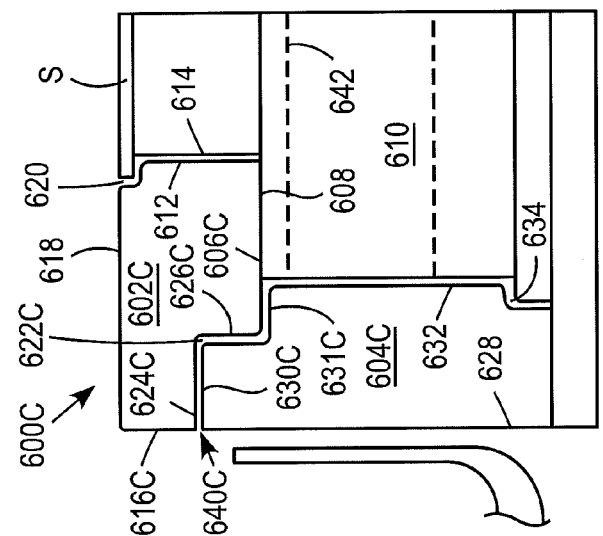
FIGS. 6A-F show embodiments of labyrinth edge ring assemblies.

FIG. 6A shows an edge ring assembly 600 comprising upper ring 602 and lower ring 604. The upper ring 602 includes a lower surface 606 which is supported on an annular surface 608 of temperature controlled base 610, an inner side surface 612 which faces a cylindrical side surface 614 of the base 610, an outer side surface 616 exposed to the plasma environment, a top surface 618 (surrounding a substrate S supported on the base) exposed to the plasma environment, an upper step 620 which underlies an outer periphery of the substrate, a lower step 622 comprising an outer lower surface 624 and outer lower side wall 626. Lower edge ring 604 includes outer surface 628, top surface 630, inner side surface 632 and lower step 634 at the bottom of inner wall 632. A gap 640 having a width (W) of 0.003 to 0.055 inch between opposed surfaces of the upper and lower edge rings 602, 604 has a length (L) sufficient to prevent arcing at the location of brazed joint 642. Thus, an aspect ratio of L/W is preferably at least 20 for the average gap width.

Figure 6B:
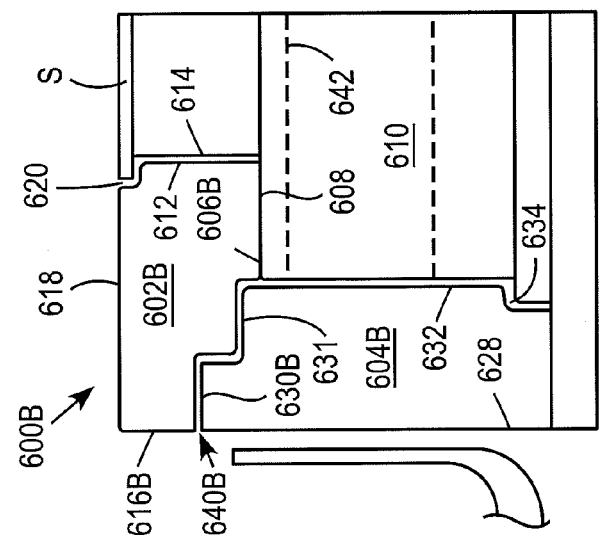

FIG. 6B shows an edge ring assembly 600B comprising upper ring 602B and lower ring 604B. The upper ring 602B includes a lower surface 606B which is supported on an annular surface 608 of temperature controlled base 610, an inner side surface 612 which faces a cylindrical side surface 614 of the base 610, an outer side surface 616B exposed to the plasma environment, a top surface 618 (surrounding a substrate S supported on the base) exposed to the plasma environment, an upper step 620 which underlies an outer periphery of the substrate, a lower step 622 comprising an outer lower surface 624 and outer lower side wall 626. Lower edge ring 604 includes outer surface 628, top surfaces 630B, 631B, inner side surface 632 and lower step 634 at the bottom of inner wall 632. A gap 640 having a width (W) of 0.003 to 0.055 inch between opposed surfaces of the upper and lower edge rings 602B, 604B has a length (L) sufficient to prevent arcing at the location of brazed joint 642. Thus, an aspect ratio of L/W is preferably at least 20 for the average gap width.

Figure 6C:
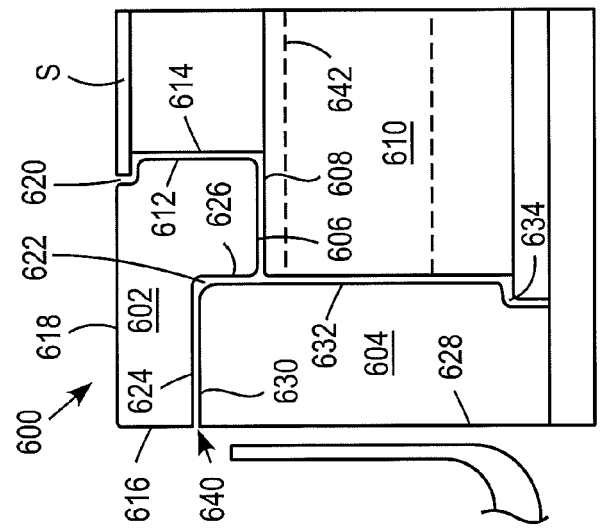

FIG. 6C shows an edge ring assembly 600C comprising upper ring 602C and lower ring 604C. The upper ring 602C includes a lower surface 606C which has an inner portion supported on an annular surface 608 of temperature controlled base 610 and an outer portion extending beyond the support surface, an inner side surface 612 which faces a cylindrical side surface 614 of the base 610, an outer side surface 616C exposed to the plasma environment, a top surface 618 (surrounding a substrate S supported on the base) exposed to the plasma environment, an upper step 620 which underlies an outer periphery of the substrate, a lower step 622C comprising an outer lower surface 624C and outer lower side wall 626C. Lower edge ring 604C includes outer surface 628, top surfaces 630C, 631C, inner side surface 632 and lower step 634 at the bottom of inner wall 632. A gap 640C having a width (W) of 0.003 to 0.055 inch between opposed surfaces of the upper and lower edge rings 602C, 604C has a length (L) sufficient to prevent arcing at the location of brazed joint 642. Thus, an aspect ratio of L/W is preferably at least 20 for the average gap width.

Figure 6D:
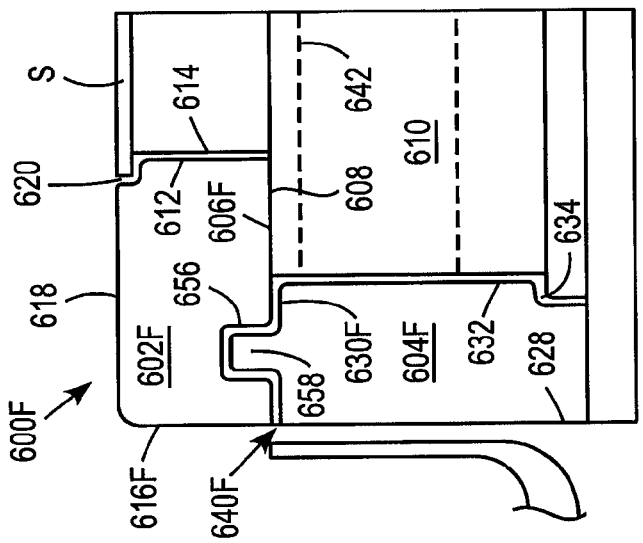

FIG. 6D shows an edge ring assembly 600D comprising upper ring 602D and lower ring 604D. The upper ring 602D includes a lower surface 606D which has an inner portion supported on an annular surface 608 of temperature controlled base 610 and an outré portion extending outward of the support surface, an inner side surface 612 which faces a cylindrical side surface 614 of the base 610, an outer side surface 616D exposed to the plasma environment, a top surface 618 (surrounding a substrate S supported on the base) exposed to the plasma environment, an upper step 620 which underlies an outer periphery of the substrate, and an annular groove 650 facing an annular groove 652 in lower edge ring 604D. A dielectric ring 654 is mounted in the grooves 650, 652. Lower edge ring 604D includes outer surface 628, top surface 630D, inner side surface 632 and lower step 634 at the bottom of inner wall 632. A gap 640D having a width (W) of 0.003 to 0.055 inch between opposed surfaces of the upper and lower edge rings 602D, 604D has a length (L) extended by the dielectric ring 654 sufficient to prevent arcing at the location of brazed joint 642. Thus, an aspect ratio of L/W is preferably at least 20 for the average gap width.

Figure 6E:
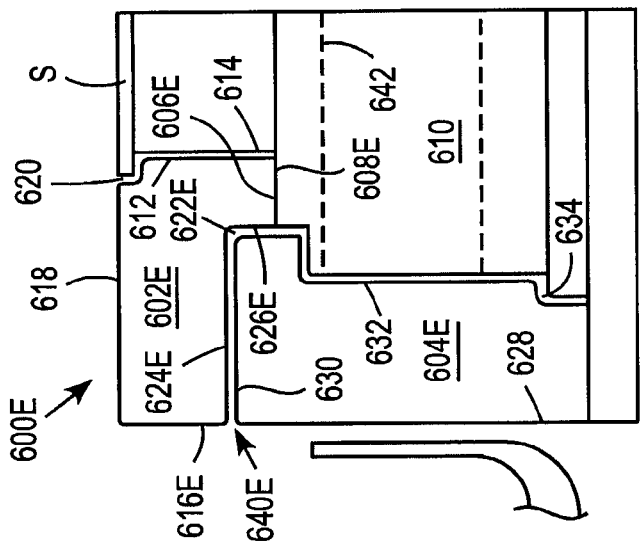

FIG. 6E shows an edge ring assembly 600E comprising upper ring 602E and lower ring 604E. The upper ring 602E includes a lower surface 606E supported on an annular surface 608 of temperature controlled base 610, an inner side surface 612 which faces a cylindrical side surface 614 of the base 610, an outer side surface 616E exposed to the plasma environment, a top surface 618 (surrounding a substrate S supported on the base) exposed to the plasma environment, an upper step 620 which underlies an outer periphery of the substrate, a lower step 622E comprising an outer lower surface 624E and outer lower side wall 626E. Lower edge ring 604E includes outer surface 628, top surface 630E, inner side surface 632 and lower step 634 at the bottom of inner wall 632. A gap 640E having a width (W) of 0.003 to 0.055 inch between opposed surfaces of the upper and lower edge rings 602E, 604E has a length (L) sufficient to prevent arcing at the location of brazed joint 642. Thus, an aspect ratio of L/W is preferably at least 20 for the average gap width.

Figure 6F:
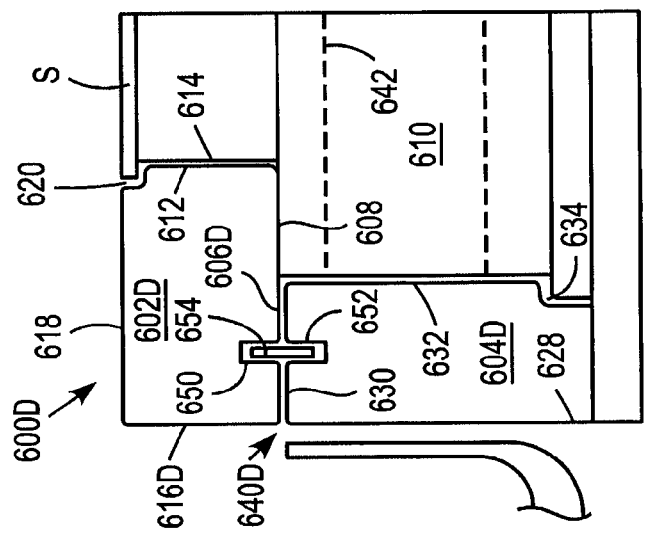

FIG. 6F shows an edge ring assembly 600F comprising upper ring 602F and lower ring 604F. The upper ring 602F includes a lower surface 606 which is supported on an annular surface 608 of temperature controlled base 610 and an outer portion of surface 606F includes an annular recess which receives annular projection 658 extending upwardly from lower edge ring 604F, an inner side surface 612 which faces a cylindrical side surface 614 of the base 610, an outer side surface 616F exposed to the plasma environment, a top surface 618 (surrounding a substrate S supported on the base) exposed to the plasma environment, and an upper step 620 which underlies an outer periphery of the substrate. Lower edge ring 604F includes outer surface 628, top surface 630F, inner side surface 632 and lower step 634 at the bottom of inner wall 632. A gap 640F having a width (W) of 0.003 to 0.055 inch between opposed surfaces of the upper and lower edge rings 602F, 604F has a length (L) sufficient to prevent arcing at the location of brazed joint 642. Thus, an aspect ratio of L/W is preferably at least 20 for the average gap width.

The terms "comprises" and "comprising" as used herein are taken to specify the presence of stated features, steps, or components; but the use of these terms does not preclude the presence or addition of one or more other features, steps, components, or groups thereof.

All of the above-mentioned references are herein incorporated by reference in their entirety to the same extent as if each individual reference was specifically and individually indicated to be incorporated herein by reference in its entirety.

While the invention has been described with reference to preferred embodiments, it is to be understood that variations and modifications may be resorted to as will be apparent to those skilled in the art. Such variations and modifications are to be considered within the purview and scope of the invention as defined by the claims appended hereto.

What is claimed is:

1. A lower electrode assembly for use in a plasma processing chamber, comprising:
   (a) a metal base comprising metal plates:
      (i) a braze line on a lower side surface at a location of a brazed joint metallurgically bonding the metal plates together;
      (ii) an edge ring support surface extending horizontally inwardly from the lower side surface; and
      (iii) an upper side surface above the edge ring support surface;
   (b) an upper edge ring comprising a lower surface mounted on the edge ring support surface;
   (c) a lower edge ring surrounding the lower side surface; and
   (d) a gap between opposed surfaces of the upper and lower edge rings and between the lower edge ring and an outer periphery of the base, the gap having an aspect ratio of total gap length to average gap width sufficient to impede arcing at a location of the braze line.

2. The lower electrode assembly of claim 1, wherein the aspect ratio is at least 20.

3. The lower electrode assembly of claim 1, wherein the lower and/or upper edge rings comprise a dielectric material.

4. The lower electrode assembly of claim 3, wherein the dielectric material comprises at least one selected from the group consisting of yttria, ceria, alumina, silicon nitride and quartz.

5. The lower electrode assembly of claim 1, wherein the metal base comprises upper, middle and lower metal plates, the upper and middle plates being vacuum brazed together at an upper braze line and the middle and bottom plates being vacuum brazed together at a lower braze line.

6. The lower electrode assembly of claim 1, wherein the lower edge ring comprises a side surface opposed to the lower side surface of the metal base and extending above the edge ring support surface of the metal base.

7. The lower electrode assembly of claim 6, wherein the lower edge ring further comprises an inwardly extending projection with a lower surface thereof over an outer portion of the edge ring support surface of the metal base.

8. The lower electrode assembly of claim 1, wherein the upper edge ring comprises two steps on a lower surface thereof.

9. The lower electrode assembly of claim 1, wherein the upper and lower edge rings include opposed grooves in the opposed surfaces and a dielectric ring is located in the grooves.

10. The lower electrode assembly of claim 1, wherein the lower edge ring includes an annular projection on an upper surface of thereof and the upper edge ring includes an annular recess in which the annular projection is received.

11. The lower electrode assembly of claim 1, wherein the upper edge ring includes a single step in the lower surface thereof, the step extending at least 0.25 inch into the lower surface and the lower edge ring has a height greater than a lower sidewall of the base such that an upper portion of the lower edge ring fits within a recess formed by the step.

12. The lower electrode assembly of claim 1, wherein the upper edge ring includes a surface which is directly exposed to plasma when the lower electrode assembly is used in the plasma processing chamber.

* * * * *